(12) United States Patent
Üstünberk et al.

(10) Patent No.: US 11,912,129 B2
(45) Date of Patent: Feb. 27, 2024

(54) CONDUCTIVE MULTILAYER PANEL FOR THE COCKPIT OF VEHICLES, IN PARTICULAR MOTOR VEHICLES

(71) Applicant: MARTUR ITALY S.R.L., Milan (IT)

(72) Inventors: Can Üstünberk, Grugliasco (IT); Luciano Scaltrito, Grugliasco (IT)

(73) Assignee: MARTUR ITALY S.R.L., Milan (IT)

(*) Notice: Subject to any disclaimer, the term of this patent is extended or adjusted under 35 U.S.C. 154(b) by 443 days.

(21) Appl. No.: 17/312,037

(22) PCT Filed: Sep. 11, 2020

(86) PCT No.: PCT/IB2020/058458
§ 371 (c)(1),
(2) Date: Jun. 9, 2021

(87) PCT Pub. No.: WO2021/048805
PCT Pub. Date: Mar. 18, 2021

(65) Prior Publication Data
US 2022/0024317 A1 Jan. 27, 2022

(30) Foreign Application Priority Data
Sep. 13, 2019 (IT) ........................ 102019000016313

(51) Int. Cl.
*B60K 37/04* (2006.01)
*B60R 13/02* (2006.01)
(Continued)

(52) U.S. Cl.
CPC .......... *B60K 37/04* (2013.01); *B60R 13/0256* (2013.01); *H01R 12/77* (2013.01);
(Continued)

(58) Field of Classification Search
CPC .... B60K 37/00; B60K 37/04; B60K 2370/42; B60K 2370/44; B60K 2370/46;
(Continued)

(56) References Cited

U.S. PATENT DOCUMENTS 3,424,264 A 1/1969 Long et al.
4,831,278 A * 5/1989 Ueda et al. .................. 307/10.1
(Continued)

FOREIGN PATENT DOCUMENTS

CN 101640972 A 2/2010
CN 206118161 U 4/2017
(Continued)

OTHER PUBLICATIONS

International Search Report and Written Opinion of the International Searching Authority issued for International PCT Application No. PCT/IB2020/058458 dated Jan. 19, 2021.

*Primary Examiner* — Dennis H Pedder
(74) *Attorney, Agent, or Firm* — Howson & Howson LLP

(57) ABSTRACT

A panel intended for the cockpit of a vehicle is conductive so that a large number of electrical and electronic devices can be installed inside the cockpit. The panel has a structure consisting of a plurality of layers of substantially equal shape and size, superimposed and firmly coupled to one another. One of the layers consists of a flexible printed circuit board that extends substantially over the entire surface of the panel, or at least over a substantial portion thereof, and that is provided with electrical connectors arranged at positions where the electrical and electronic devices associated with the dashboard are to be subsequently installed. Wired connections of electrical and electronic devices associated with the dashboard are eliminated. This entails a considerable simplification when making electrical connections to these electrical and electronic devices, as (Continued)

well as in the case of subsequent maintenance and/or repair work.

19 Claims, 3 Drawing Sheets

(51) Int. Cl.
*H01R 12/77* (2011.01)
*H05K 1/11* (2006.01)
*H05K 1/14* (2006.01)

(52) U.S. Cl.
CPC .............. *H05K 1/118* (2013.01); *H05K 1/144* (2013.01); *B60K 2370/42* (2019.05); *B60K 2370/46* (2019.05); *B60K 2370/586* (2019.05); *B60K 2370/654* (2019.05)

(58) Field of Classification Search
CPC ........ B60K 2370/586; B60K 2370/654; B60R 2013/0287
USPC .......................................................... 296/70
See application file for complete search history.

(56) References Cited

U.S. PATENT DOCUMENTS

| | | | |
|---|---|---|---|
| 6,669,273 | B1 | 12/2003 | Glovatsky et al. |
| 7,948,762 | B2 | 5/2011 | Castillo Garcia et al. |
| 2004/0080459 | A1 | 4/2004 | Marx |
| 2009/0058118 | A1 | 3/2009 | Hein et al. |
| 2019/0069403 | A1 | 2/2019 | Heikkinen et al. |
| 2019/0329652 | A1 | 10/2019 | Sumiya |

FOREIGN PATENT DOCUMENTS

| | | |
|---|---|---|
| EP | 3251540 A1 | 12/2017 |
| GB | 2346352 A | 8/2000 |
| JP | H02-128944 A | 5/1990 |
| JP | 2006-310643 A | 11/2006 |

* cited by examiner

CONDUCTIVE MULTILAYER PANEL FOR THE COCKPIT OF VEHICLES, IN PARTICULAR MOTOR VEHICLES

TECHNICAL FIELD OF THE INVENTION

The present invention relates to a conductive multilayer panel for a vehicle cockpit, in particular a motor vehicle.

More particularly, the present invention relates to a conductive multilayer covering panel for the vehicle cockpit, in particular a motor vehicle.

In particular, the present invention relates to a conductive multilayer covering panel for the cockpit of a motor vehicle that meets the modern requirement to install a high number of electrical and electronic devices inside said cockpit.

The invention finds particular, though not exclusive, application in the manufacturing of conductive dashboards for vehicles, especially motor vehicles.

BACKGROUND ART

The cockpit front panel of a motor vehicle is generally defined as the blind bulkhead, located under the windscreen of the vehicle, which anteriorly delimits the cockpit from the bonnet and the engine compartment.

Using a term of nautical derivation, the upper part of the front panel is now universally referred to as "dashboard" (in Italian language: plancia) due to the presence of the vehicle instrumentation control panel therein.

In fact, in recent times, the number of electrical and electronic devices associated with the dashboard of a motor vehicle has been multiplied and, in addition to the control panel of the vehicle instrumentation, numerous other devices that are related to the operation of the vehicle, the safety and comfort of passengers have been added.

As a non-exhaustive example, it can be seen that all vehicles are now equipped with an "infotainment" system positioned on the dashboard, or that more and more vehicles are equipped with a navigation system also positioned on the dashboard.

According to prior art, the electrical and electronic connections associated with the dashboard for the vehicle cockpit (such as, for example, the connections to the respective electric power supply sources or the connections to the respective control units) are made by means of wired connections, for example by using copper wires with circular cross-section.

Other covering panels in the cockpit of a motor vehicle, such as door covering panels, may also have electrical and electronic devices associated therewith.

Also in this case, the electrical connections of the electrical and electronic devices associated with said covering panels are made by means of wired connections, for example by using copper wires with circular cross-section.

This solution, however, has remarkable drawbacks.

In fact, the presence of wired connections implicates the need, at the stage of the motor vehicle production, to use skilled labor for the manufacturing and assembling of these wired connections.

This need for skilled labor also exists in the case of repair of possible breakdowns and maintenance work.

Moreover, the complexity of the interventions for the realization of the above mentioned electrical connections increases drastically as the number of electrical and electronic devices associated with the dashboard or other covering panels increases.

As a result, even with the use of highly skilled labor, manufacturing times increase and the risk of human error is not negligible.

In addition, as the number of electrical and electronic devices associated with the dashboard or other covering panels in the vehicle cockpit increases, the overall weight of the copper wires required for the wired connections increases considerably.

This increase in weight is considered a not insignificant inconvenience, since there is a continuous effort to limit the overall weight of all vehicle components.

Furthermore, the increase in the quantity of copper wires leads to a considerable increase in the costs, to both the cost of copper wires per se and the cost of the accessories needed for connecting them.

In the case of electrical connections for power transmission, another important drawback related to the use of wired connections is the risk of an increase in wire temperature, which involves a maximum limit of current that can pass through the wires: if an excessive current passes through these wires, the temperature increases, and with it the electrical resistance; the increase in electrical resistance in turn induces an increase in energy dissipation, with a consequent increase in temperature.

Therefore, a risk of serious breakdowns can occur in the vehicle cockpit and, consequently, accidents can happen.

Therefore, a main object of the present invention is to provide a conductive multilayer panel for the cockpit of a motor vehicle that allows to overcome the limitations of the prior art described above.

In particular, an object of the present invention is to provide a conductive multilayer panel for the cockpit of a motor vehicle that allows to simplify the installation and connections of the electrical and electronic devices associated therewith, with a consequent weight reduction of the material required for such connections, the cost of the materials required for such connections and the manufacturing times.

An object of the present invention is also to avoid the need for highly skilled labor to manufacture, maintain and repair the electrical connections of such electrical and electronic devices, eliminating (or at least drastically reducing) the risk of human error at the same time.

Another object of the present invention is to avoid the risk of breakdowns or accidents related to the overheating of wired connections of said electrical and electronic devices.

These and other objects are achieved with the conductive multilayer panel as claimed in the appended claims.

SUMMARY OF THE INVENTION

The conductive multilayer panel for cockpit of a vehicle, in particular a motor vehicle, according to the invention comprises a multilayer structure, wherein one of the layers of said multilayer structure consists of a flexible printed circuit board or FPCB ("Flexible Printed Circuit Board").

In this context, "multilayer structure" means a structure made by a plurality of layers of equal shape and size, superimposed and firmly coupled to one another, for example by mechanical coupling, gluing, welding.

In this respect, it should be noted that in the state of the art there are examples about applications of flexible printed circuit boards for the automotive field, and in particular, in combination with the dashboard for the cockpit of a motor vehicle; see, for example, documents GB 2 346 352 and EP 1 956874.

Document U.S. Pat. No. 6,669,273 describes a dashboard assembly for the cockpit of a vehicle which includes a cross-car beam extended over a substantial part of the cockpit. Said cross-car beam defines a plurality of mounting sites, usually flat, for electrical and/or electronic devices and further defining at least one recess; a printed circuit board, possibly a flexible printed circuit board is mounted at said recess and a removable covering element is placed on said printed circuit board.

Firstly, in the dashboard assembly described in U.S. Pat. No. 6,669,273, the printed circuit board is applied to the cross-car beam, and not to the dashboard for the cockpit of the vehicle; secondly, it has a limited extension with respect to the said cross-car beam, whereby planar wiring ("flat wire bus") is necessary between said printed circuit board and the electrical and electronic devices placed in the mounting sites.

Document GB 1 175 682 describes a vehicle dashboard structure comprising a mobile front panel carrying a number of electrical and electronic devices, a fixed rear panel and a flexible printed circuit board arranged between said rear panel and said front panel. This flexible printed circuit board includes seats where corresponding connectors for connection to the electrical wire network of the vehicle can be inserted.

It is clear that document GB 1 175 682 does not describe any multilayer structure in the sense of this context. In this case, too, the presence of the flexible printed circuit board does not allow to eliminate the wired connections to the electrical and electronic devices of the dashboard.

Document US 2009/058118 describes a panel for the cockpit of a vehicle to which an interface is applied. This interface can be backlit by using a printed circuit board provided with lighting devices.

In this case, too, the printed circuit board does not extend over a substantial portion of the panel, but it is part of a separate interface, limited in size, which is applied to a portion of said panel.

Document US 2004/080459 describes a panel for the cockpit of a vehicle that includes a substrate, a layer of electrical circuitry/antenna applied to said substrate, and a covering layer that covers said layer of electrical circuitry/antenna. Said layer of circuitry/antenna is equipped with connectors that fit into corresponding openings provided in the substrate; the use of flexible printed circuit boards for the electrical circuitry/antenna layer is mentioned in this document.

Document US 2004/080459 therefore does not describe a multilayer structure in the sense of this context. In this case, too, the flexible printed circuit board has a limited extension with respect to the substrate below.

JP H 02-128944 describes an instrument dashboard for the cockpit of a vehicle in which a flexible printed circuit board and two rigid backing plates between which said flexible printed circuit board is sandwiched are embedded in an expanded matrix. Therefore, document JP H 02-128944 does not describe any multilayer structure in the sense of the present context.

It emerges from the above that, in general, known applications refer to point applications of flexible printed circuit boards with small size.

However, it is neither described nor suggested by the state of the art to make a conductive multilayer panel for the cockpit of motor vehicle with a multilayer structure in which one of the layers consists of a flexible printed circuit board having a large area.

According to the invention, instead, the multilayer structure is made by a plurality of layers of equal shape and size superimposed and firmly coupled to one another and consequently the flexible printed circuit board, which is one of the layers of the aforementioned multilayer structure, extends substantially over the entire surface of the conductive multilayer panel, or at least over a substantial portion thereof.

In particular, the flexible printed circuit board extends over a substantial portion of the panel comprising the regions in which it is necessary to provide conductive tracks for control signal transmission and power supply transmission to electrical and electronic devices.

Preferably, the multilayer structure of the panel according to the invention further comprises at least one supporting layer for supporting the flexible printed circuit board and possibly an outer covering layer, adapted, for example, to give the conductive multilayer panel the desired aesthetical appearance (especially when this is a covering panel).

According to a preferred embodiment of the invention, the flexible printed circuit board constitutes the rear layer of the multilayer structure, i.e. the extreme layer of said multilayer structure opposite to the outer covering layer.

This particular embodiment remarkably differs from the known solutions described above, in which the printed circuit board is sandwiched between a supporting structure and a covering element.

Due to the fact that the flexible printed circuit board is the extreme layer of the multilayer structure, farthest from the interior space of the cockpit of the vehicle, it does not risk interfering with the correct operation of the airbags in the case of an accident; in particular, it does not risk interfering with the correct opening of the doors of the airbag housings.

Furthermore, due to the fact that the flexible printed circuit board is an extreme layer of the multilayer structure, operations for maintenance, repair and replacement of said flexible printed circuit board will be particularly easy and will not affect the remaining layers of the multilayer structure. If, instead, the flexible printed circuit board were an intermediate layer of the multilayer structure, a failure or malfunction of this printed circuit board would mean that the entire panel would have to be replaced.

According to the invention, said flexible printed circuit board is provided with electrical connectors at the positions where the electrical and electronic devices associated with the dashboard have to be subsequently installed.

Said electrical connectors are suitable to be directly coupled with the respective connectors of said electrical and electronic devices.

According to a preferred embodiment of the invention, said electrical connectors are made as rigid elements with small size.

According to said preferred embodiment of the invention, said flexible printed circuit board, with its connectors, is used for both control signal transmission and power transmission.

As a result, the invention allows to completely eliminate the wired connections of electrical and electronic devices associated with the dashboard.

This entails a considerable simplification when making electrical connections to these electrical and electronic devices, as well as in the case of subsequent maintenance and/or repair work.

Moreover, the overall weight of the structure for the electrical connection of electrical and electronic devices is also drastically reduced, and substantially equal to the weight of the flexible printed circuit board.

In addition, advantageously, the weight of the said flexible printed circuit board is independent of the number of electrical and electronic devices connected thereto, whereby it remains substantially unchanged even in the case of an increase in the number of said electrical and electronic devices.

Similarly, the overall cost of the structure for the electrical connection of electrical and electronic devices is also drastically reduced, and substantially equal to the cost of the flexible printed circuit board.

In this case, too, the cost of said flexible printed circuit board is independent of the number of electrical and electronic devices connected thereto, whereby it remains substantially unchanged even in the case of an increase in the number of said electrical and electronic devices.

Furthermore, the use of a flexible printed circuit board in the conductive multilayer panel according to the invention allows to optimize heat exchanges and to avoid risky temperature increases, also due to the high surface/volume ratio of the conductive tracks in the flexible printed circuit board.

In a preferred embodiment of the invention, the flexible printed circuit board in turn has a multilayer structure, consisting of an alternation of metal and insulating polymer layers.

If this flexible printed circuit board is used for both control signal transmission and power transmission, it will preferably include one or more layers dedicated to control signal transmission and one or more layers dedicated to power transmission.

The invention allows a considerable reduction in manufacturing times and an equally considerable reduction in human error, even when no highly skilled labor is used.

More generally, the invention leads to an overall improvement in the quality of the process for obtaining a conductive multilayer panel, because an automated process is less prone to human error, is faster and allows a smaller production of waste, which makes the manufacturing process of the conductive multilayer panel according to the invention both cheaper and more environmentally-friendly than the production processes of known panels with wired connections.

In addition, the automated process that can be used to obtain the conductive multilayer panel according to the invention makes it possible to obtain a higher quality product, from which it is possible to expect greater reliability in control signal transmission and power transmission than the known solutions, in which wires are assembled manually.

Essentially, the method for making a conductive multilayer panel according to the invention can include the following steps:
- If the flexible printed circuit board itself has a multilayer structure, assembling the layers of said printed circuit board, e.g. by laser welding;
- Coupling said flexible printed circuit board to the remaining layers of the multilayer structure, preferably as the extreme layer of said multilayer structure farthest from the interior space of the cockpit of the vehicle.

Said coupling step takes place at a low temperature in order not to damage the materials forming the flexible printed circuit board.

In a preferred, though non-limiting, embodiment of the invention, the conductive multilayer panel for the cockpit of a vehicle, in particular a motor vehicle, is a covering panel for the cockpit of a motor vehicle, and preferably the dashboard for the cockpit of a motor vehicle.

BRIEF DESCRIPTION OF DRAWINGS

Further features and advantages will become more apparent from the ensuing description of a preferred embodiment of the invention, given by way of non-limiting example, with reference to the annexed figures, in which:

FIG. 1c shows, in an enlarged scale, a detail of FIG. 1a;

DETAILED DESCRIPTION OF A PREFERRED EMBODIMENT OF THE INVENTION

In the ensuing description of a preferred embodiment of the invention, particular reference will be made to the application of the invention to the making of a conductive dashboard for the cockpit of a motor vehicle.

However, this application should not be understood in a limiting sense and the invention can also be applied to other covering panels for the cockpit of vehicles, in particular motor vehicles, such as the covering panels for the doors of a motor vehicle.

More generally, the invention can also be applied to other panels in the cockpit of a vehicle, in particular a motor vehicle, on which electrical and electronic devices are installed to which control and power supply signals must be sent.

Figure 1A:
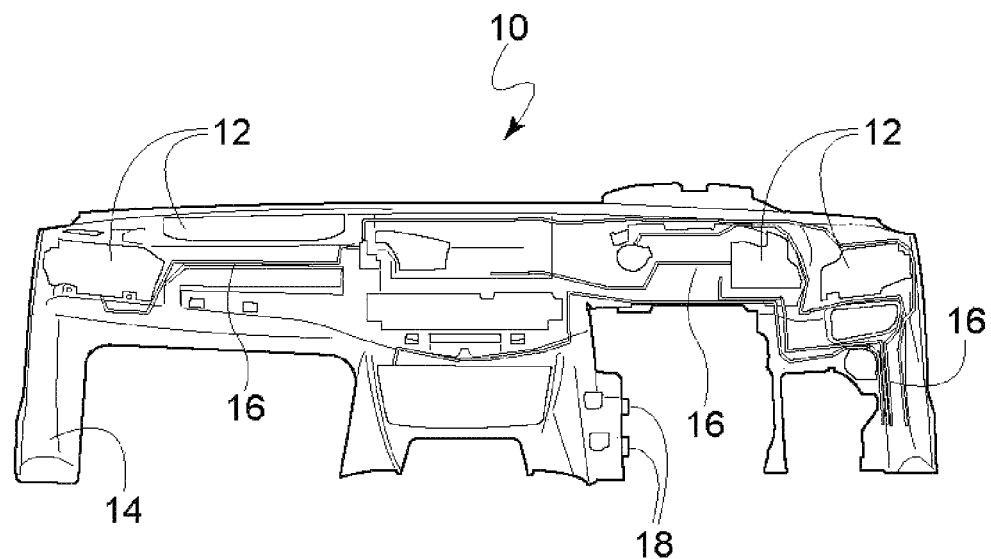
FIGS. 1a and 1b show the flexible printed circuit board of a dashboard for the cockpit of a motor vehicle made according to the invention, seen from different and opposite viewpoints.
Figure 1B:
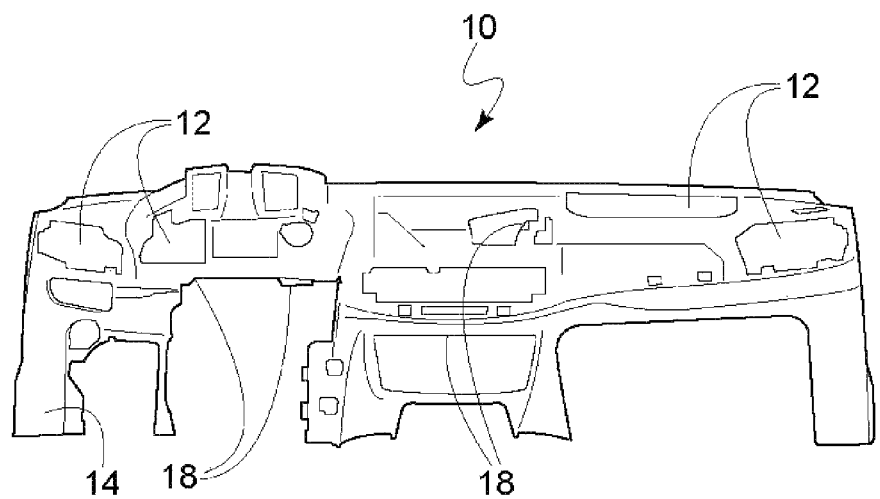

The cockpit dashboard made according to the teachings of the present invention comprises a multilayer structure in which one of the layers consists of a flexible printed circuit board. Said flexible printed circuit board 10 is illustrated in FIGS. 1a and 1b.

As can be seen from said Figures, according to the invention the term multilayer structure means a structure formed by a plurality of layers of equal shape and size, superimposed and firmly coupled to one another, and, as a result, the flexible printed circuit board 10 is sized and shaped so as to extend substantially over the entire surface of the dashboard, or at least over a substantial part thereof, and to follow the contour thereof.

The layers of the multilayer structure can be coupled to one another, e.g. by mechanical coupling, gluing, welding (especially laser welding).

In particular, said flexible printed circuit board 10 has cavities 12 at seats intended to receive the electrical and electronic devices intended to accommodate the electrical and electronic devices associated with the dashboard.

Figure 1C:
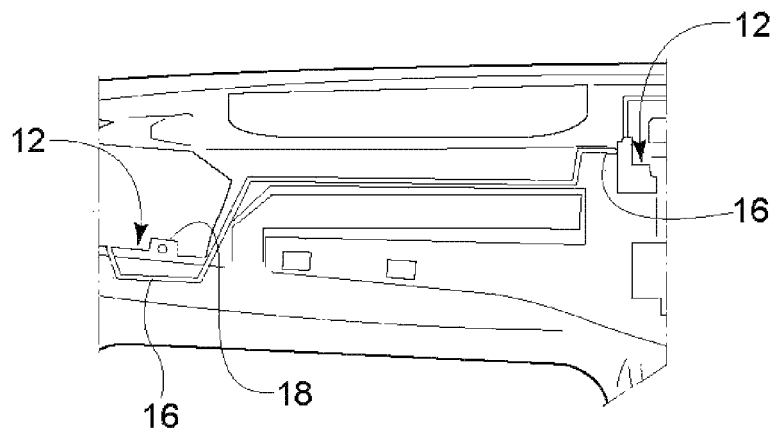

Generally, said printed circuit board 10 may include a base body 14 made of a non-conductive material on which conductive tracks 16 are engraved (better visible in the enlarged scale detail in FIG. 1c).

The non-conductive base body 14 can be made of a material such as polyimide or polyester, for example.

The conductive tracks 16 can be made of copper, for example.

The flexible printed circuit board 10 can be made by using photolithography or serigraph printing or electrochemical photoengraving techniques or any technique within the reach of the person skilled in the art.

For example, it can be made by means of the photolithographic technique. The photolithographic technique involves depositing a conductive material (e.g. a metal material such as copper) on a non-conductive support (e.g.

made of a polymer material) and subsequently depositing a "photo resist". In order to achieve the desired pattern for conductive tracks, a variety of well-known techniques can be used, including "direct writing" with UV laser, "shadow mask" with UV lamp, etc. According to the photolithographic technique, the making of the flexible printed circuit board then includes the steps of developing the "photo resist", "etching" the developed areas and "stripping" the residual "photo resist" until the desired result is obtained.

Thanks to the fact that the flexible printed circuit board 10 extends substantially over the entire surface of the dashboard, the conductive tracks can extend up to the perimeter of each of the cavities 12 and, at the perimeter of said cavity, a connector 18 can be provided for the electrical connection of the electrical or electronic device housed in the cavity.

In particular, connectors 18 provided at the different cavities 12 may be rigid connectors.

Said rigid connectors are preferably integrated to the flexible printed circuit board 10.

It will thus be evident to the person skilled in the art that the invention advantageously eliminates the need for wired connections.

Advantageously, once the configuration of the dashboard and the arrangement of the electrical and electronic devices associated therewith have been determined during the design step, the connectors 18 will be positioned on the flexible printed circuit board 10 at the desired positions.

This will allow a considerable simplification of the subsequent assembling operations, with a consequent reduction in manufacturing times.

The conductive tracks 16 of the flexible printed circuit board 10 are preferably used for both control signal transmission and power transmission of the electrical power supply.

The use of the flexible printed circuit board 10 will, in particular, allow the passage of high currents ensuring a reduced increase in temperature due to the Joule effect, thus eliminating the limitation of prior art regarding the maximum electrical current threshold.

Figure 2:
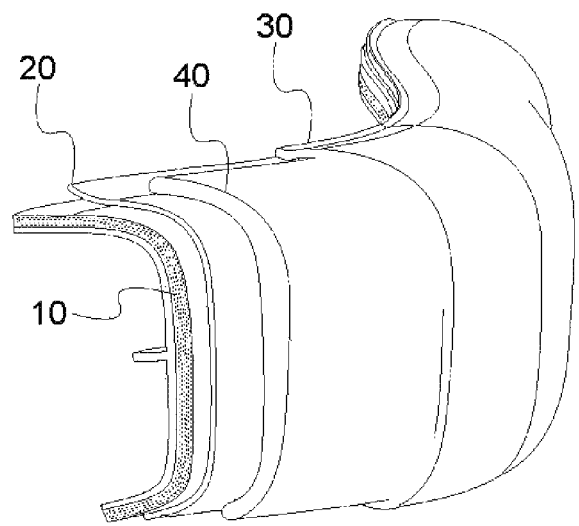
FIGS. 2 and 3 schematically show the multilayer structure of a dashboard for the cockpit of a motor vehicle made according to the invention.
Figure 3:
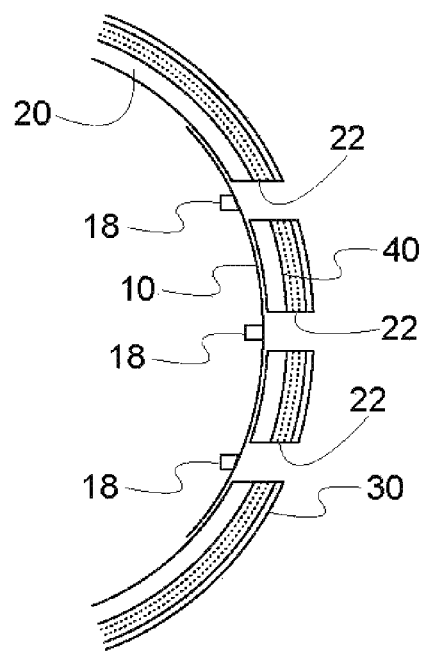

Turning now to FIGS. 2 and 3, the multilayer structure of the dashboard according to the invention is shown schematically.

Generally, said multilayer structure will comprise at least—in addition to the layer consisting of the flexible printed circuit board 10—a supporting layer 20, which is immediately adjacent to the flexible printed circuit board 10 and acts as a mechanical support for said flexible printed circuit board 10, and an outer layer 30, which basically has the function of conferring the desired aesthetical appearance to the dashboard.

As can be seen in FIGS. 2 and 3, the flexible printed circuit board 10 forms an extreme layer of the multilayer structure, and in particular the layer farthest from the cockpit of the vehicle and closest to the bonnet and engine compartments between the layers of the multilayer structure of the dashboard according to the invention.

In other words, the flexible printed circuit board 10 and the outer layer 30 are the opposite extreme layers of the multilayer structure of the dashboard.

Due to the fact that the flexible printed circuit board 10 is the layer farthest from the cockpit of the vehicle, maintenance, repair and replacement will be particularly easy.

In addition, if the multilayer panel according to the invention is used to make the dashboard for the cockpit of a vehicle, said flexible printed circuit board 10 will not risk interfering with the correct functioning of the airbags in the event of an accident.

Between this flexible printed circuit board 10—or more precisely between the support layer 20 adjacent thereto—and the outer coating layer 30, additional intermediate layers may be placed, depending on the specific applications.

The support layer 20, as well as the intermediate layers—if any—will be provided with appropriate holes 22 in correspondence with the position of the connectors 18 of the flexible printed circuit board 10 for the passage of the connectors.

As a non-limiting example, in the embodiment of FIGS. 2 and 3, between the support layer 20 and the external covering layer 30 there is a layer of foamed material (foam) 40 adapted to give a soft touch feeling to the dashboard.

It will be evident to the person skilled in the art that the number and kind of the intermediate layers may vary from time to time according to specific needs.

Although—as described above and as illustrated in FIGS. 1a and 1b—the flexible printed circuit board 10 can be made in the form of a base body 14 made of a non-conductive material on which conductive tracks 16 are engraved, according to a preferred embodiment of the invention, the flexible printed circuit board 10 in turn comprises a multilayer structure formed by an alternation of insulating and conductive layers.

Figure 4:
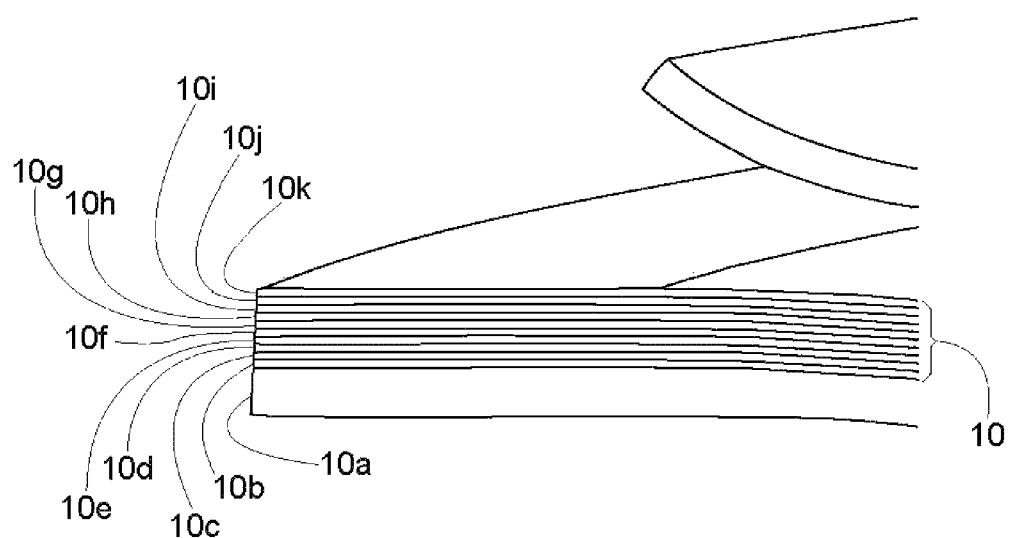
FIG. 4 schematically shows the structure of a flexible printed circuit board according to a preferred embodiment of the invention.

This multilayer structure of the flexible printed circuit board 10 is schematically illustrated in FIG. 4.

Generally, said flexible printed circuit board 10 includes several conductive layers 10b, 10d, 10f, 10h, 10j made of a metal material (e.g. copper, aluminum) alternating with insulating layers 10a, 10c, 10e, 10g, 10i, 10k made of a polymer material (e.g. polyimide).

The extreme layers 10a, 10k of said multilayer structure are preferably insulating layers.

Said layers 10a-10k can be produced separately and then assembled to form a single body, for example by means of a laser welding process able to guarantee the complete functionality of the electronic circuits.

In particular, in the embodiment shown in FIG. 4, the multilayer structure of the flexible printed circuit board includes one or more conductive layers 10d equipped with electro-conductive tracks and dedicated to power transmission and one or more conductive layers 10h equipped with electro-conductive tracks and dedicated to control signal transmission.

These two layers or groups of layers are separated from each other and shielded by additional metal layers 10b, 10f, 10j to avoid electromagnetic compatibility problems.

Generally, the multilayer structure of said flexible printed circuit board 10 comprises, starting from the end farthest from the cockpit of the vehicle:
  a first insulating polymer layer 10a, also having structural features;
  a first metal layer 10b with a shielding function;
  a second insulating polymer layer 10c;
  one or more metal layers 10d with electro-conductive tracks for power transmission;
  a third insulating polymer layer 10e;
  a second metal layer 10f with a shielding function;
  a fourth insulating polymer layer 10g;
  one or more metal layers 10h with electro-conductive tracks for control signal transmission;
  a fifth insulating polymer layer 10i;
  a third metal layer 10j with a shielding function;
  a sixth insulating polymer layer 10k.

It will be evident to the person skilled in the art that the invention is not limited to the embodiment described above and numerous changes and modifications are possible within the scope defined by the appended claims.

In particular, although in the embodiment described above reference has been made to the dashboard for the cockpit of a motor vehicle, this application should not be understood in a limiting sense and the invention can also be extended to other panels for the cockpit of vehicles, in particular to all those panels for the cockpit of a vehicle with which electrical and electronic devices are associated or may be associated.

The invention claimed is:

1. A conductive multi-layer panel for the cockpit of a vehicle, wherein the panel has a multilayer structure consisting of a plurality of layers of substantially equal shape and size, superimposed and firmly coupled to one another, wherein one of the layers of the multilayer structure consists of a flexible printed circuit board, the flexible printed circuit board extending at least over a substantial portion of the panel, wherein the flexible printed circuit board has cavities at seats intended to receive electrical and electronic devices, wherein electrical and electronic devices received in the cavities of the flexible printed circuit board have respective electrical connectors and are associated with the panel, and wherein the flexible printed circuit board is provided with conductive tracks extending up to a perimeter of the cavities.

2. The panel according to claim 1, wherein the flexible printed circuit board constitutes the extreme layer of said multilayer structure farthest from the cockpit.

3. The panel according to claim 1, wherein the flexible printed circuit board is provided with electrical connectors arranged at the perimeter of the cavities and wherein the electrical connectors of the flexible printed circuit board are adapted to connect directly to electrical connectors of the electrical and electronic devices associated with the panel.

4. The panel according to claim 3, wherein the electrical connectors of the flexible printed circuit board are made as rigid connectors integrated to the flexible printed circuit board.

5. The panel according to claim 1, wherein the flexible printed circuit board ensures both a transmission of control signal and a transmission of electric power supply.

6. The panel according to claim 5, wherein the flexible printed circuit board is provided with conductive tracks, and wherein the conductive tracks are used both for the transmission of control signals and for the transmission of electric power supply.

7. The panel according to claim 1, wherein the multilayer structure comprises a supporting layer, which is immediately adjacent to the flexible printed circuit board and acts as a mechanical support for the flexible printed circuit board.

8. The panel according to claim 7, wherein the multilayer structure further comprises an outer covering layer.

9. The panel according to claim 6, wherein the flexible printed circuit board and the outer covering layer are the opposite extreme layers of the multilayer structure, the flexible printed circuit board constituting the extreme layer of the multilayer structure farthest from the cockpit, and the outer covering layer constituting the extreme layer of the multilayer structure closest to the cockpit.

10. The panel according to claim 8, wherein one or more intermediate layers are sandwiched between the supporting layer and the outer covering layer.

11. The panel according to claim 10, wherein the supporting layer and the one or more intermediate layers are provided with through-holes for passage of the electrical connectors of the flexible printed circuit board.

12. The panel according to claim 1, wherein the flexible printed circuit board has a multilayer structure comprising a plurality of conductive layers made of a metal material and alternating with insulating layers made of a polymer material.

13. The panel according to claim 12, wherein the multilayer structure of the flexible printed circuit board has opposite extreme layers and the opposite extreme layers of the multilayer structure of the flexible printed circuit board are insulating layers.

14. The panel according to claim 12, wherein the multilayer structure of the flexible printed circuit board comprises one or more conductive layers made of a metal material provided with electro-conductive tracks and intended for power transmission, and one or more conductive layers made of a metal material provided with electro-conductive tracks and intended for control signal transmission.

15. The panel according to claim 14, wherein the one or more conductive layers made of a metal material provided with electro-conductive tracks and intended for power transmission and the one or more conductive layers made of a metal material provided with electro-conductive tracks and intended for control signal transmission are separated from one another and shielded by further conductive layers made of a metal material.

16. The panel according to claim 12, wherein the multilayer structure of the flexible printed circuit board comprises, starting from the end farthest from the cockpit of the vehicle:

a first insulating layer made of a polymer material, having structural features;

a first conductive layer made of a metal material with a shielding function;

a second insulating layer made of a polymer material;

one or more conductive layers made of a metal material with electro-conductive tracks for power transmission;

a third insulating layer made of a polymer material;

a second conductive layer made of a metal material with a shielding function;

a fourth insulating layer made of a polymer material;

one or more conductive layers made of a metal material with electro-conductive tracks for control signal transmission;

a fifth insulating layer made of a polymer material;

a third conductive layer made of a metal material with a shielding function;

a sixth insulating layer made of a polymer material.

17. The panel according to claim 1, wherein the vehicle is a motor vehicle and the conductive multilayer panel is a panel for covering the cockpit of the motor vehicle.

18. The panel according to claim 1, wherein the flexible printed circuit board extends substantially throughout the entire panel.

19. The panel according to claim 1, wherein the vehicle is a motor vehicle and the conductive multilayer panel is a dashboard for a cockpit of the motor vehicle.

* * * * *